(12) United States Patent
Murayama et al.

(10) Patent No.: US 7,091,453 B2
(45) Date of Patent: Aug. 15, 2006

(54) HEAT TREATMENT APPARATUS BY MEANS OF LIGHT IRRADIATION

(75) Inventors: Hiromi Murayama, Kyoto (JP); Tatsufumi Kusuda, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 0 days.

(21) Appl. No.: 10/780,420

(22) Filed: Feb. 17, 2004

(65) Prior Publication Data

US 2004/0169032 A1 Sep. 2, 2004

(30) Foreign Application Priority Data

Feb. 27, 2003 (JP) ............... 2003-050896
Apr. 18, 2003 (JP) ............... 2003-114036

(51) Int. Cl.
*F27B 5/14* (2006.01)

(52) U.S. Cl. ............ 219/390; 219/405; 219/411; 392/416; 392/418; 118/724; 118/725; 118/50.1

(58) Field of Classification Search ......... 219/390, 219/405, 411; 118/724, 725, 50.1; 392/416, 392/418

See application file for complete search history.

(56) References Cited

U.S. PATENT DOCUMENTS

| | | | | |
|---|---|---|---|---|
| 4,567,352 A | * | 1/1986 | Mimura et al. ............ | 219/405 |
| 4,649,261 A | | 3/1987 | Sheets ..................... | 219/390 |
| 5,405,444 A | * | 4/1995 | Moslehi .................... | 118/725 |
| 6,035,101 A | * | 3/2000 | Sajoto et al. ............ | 392/416 |
| 6,301,434 B1 | * | 10/2001 | McDiarmid et al. ........ | 392/416 |
| 6,331,212 B1 | * | 12/2001 | Mezey, Sr. ................ | 118/725 |
| 2002/0011205 A1 | | 1/2002 | Yamazaki et al. .......... | 118/620 |

FOREIGN PATENT DOCUMENTS

| | | | |
|---|---|---|---|
| JP | 57-162340 | | 10/1982 |
| JP | 59-169125 | | 9/1984 |
| JP | 60-258928 | | 12/1985 |
| JP | 63-166219 | * | 7/1988 |
| JP | 2000-306856 | | 11/2000 |
| JP | 2001-127001 | | 5/2001 |
| JP | 2001-237195 | | 8/2001 |
| JP | 2002-060926 | | 2/2002 |
| JP | 2002-313727 | | 10/2002 |

* cited by examiner

*Primary Examiner*—Shawntina Fuqua
(74) *Attorney, Agent, or Firm*—Ostrolenk, Faber, Gerb & Soffen, LLP (57) ABSTRACT

A chamber has a wall surface fitted with a liner. The liner is removably provided to the chamber with no fixed relation therebetween. By simply opening a light source to remove a heat diffusion plate, a hot plate and a tubular member from the chamber, the liner can be easily detached accordingly from the chamber. When a semiconductor wafer cracks to litter the chamber with its fragments, the chamber can be easily cleaned by simply detaching the liner. The liner has an outer surface subjected to surface roughening by honing. When a flash lamp emits flashlight of considerably high intensity, the roughened outer surface of the liner serves to block this flashlight. As a result, the metal surface inside the chamber is prevented from being exposed to the flashlight emitted from the flash lamp.

18 Claims, 5 Drawing Sheets

HEAT TREATMENT APPARATUS BY MEANS OF LIGHT IRRADIATION

BACKGROUND OF THE INVENTION

1. Field of the Invention

The present invention relates to a heat treatment apparatus for heat-treating a semiconductor wafer or a glass substrate (hereinafter simply referred to as a "substrate") by means of light irradiation thereon.

2. Description of the Background Art

Conventional ion activation process of a semiconductor wafer after being subjected to ion implantation employs a heat treatment apparatus such as a lamp annealing apparatus using a halogen lamp. In such a heat treatment apparatus, a semiconductor wafer is heated up (annealed) to a temperature of about 1000 to 1100° C. to realize ion activation of the semiconductor wafer. Light energy emitted from the halogen lamp is operative to cause temperature rise of the wafer at a speed of about several hundreds of degrees centigrade per second.

An example of a lamp annealing apparatus using a halogen lamp is introduced in Japanese Patent Application Laid-Open No. 2001-127001, in which a metal surface in a processing chamber is covered with a coating material to suppress diffusion of metallic component from the metal surface during heat treatment.

Even in a heat treatment apparatus which realizes ion activation of a semiconductor wafer by means of temperature rise of the wafer at a speed of about several hundreds of degrees centigrade per second, ions implanted into the semiconductor wafer exhibit a rounded profile, which means ion diffusion by heat. Occurrence of this phenomenon necessitates implantation of ions in a greater amount than necessary, as the surface of the semiconductor wafer subjected to ion implantation with even high concentration experiences diffusion of the implanted ions therefrom.

In response, the surface of a semiconductor wafer is irradiated with flashlight by a xenon flash lamp, for example, so that only the surface of the semiconductor wafer implanted with ions is allowed to rise in temperature in a very short period of time of not longer than several milliseconds. An example of such a technique is introduced in Japanese Patent Application Laid-Open No. 59-169125 (1984) and No. 63-166219 (1988). Temperature rise in a very short period of time by use of a xenon flash lamp does not allow a period long enough for ion diffusion, thereby realizing ion activation with no rounding of a profile of ions implanted into a semiconductor wafer.

In a conventional heat treatment apparatus using a xenon flash lamp, a semiconductor wafer is contained in a stainless steel chamber, and the wafer surface is irradiated with flashlight. At this time, the inner wall of the chamber is also subjected to irradiation with flashlight emitted from the flash lamp.

The light emitted from the xenon flash lamp has considerably high intensity, which may result in generation of a brown oxide film during heat treatment that covers a metal surface inside the chamber. Even a slight source of contamination may result in imperfect treatment in light of recent trends toward high precision of a semiconductor device, for example. Generation of such an oxide film is thus unfavorable.

Necessity to minimize the source of contamination leading to particle contamination or metal contamination is not limited to an apparatus employing heating system by means of light irradiation, but is common to a conventional heat treatment apparatus for a semiconductor device, for example. Japanese Patent Application Laid-Open No. 2002-60926 suggests a cleaning technique responsive thereto, in which a deposited material adhered to a component in a heat treatment chamber, for example, is heated to sublimate. Another cleaning technique includes removal of a product of the decomposition of source gas adhered to a heat treatment chamber by means of heat treatment in an atmosphere such as halogen gas, an example of which is suggested in Japanese Patent Application Laid-Open No. 2002-313727.

In addition to the foregoing adherence of a deposited material, contamination of a heat treatment chamber results from various reasons. By way of example, a semiconductor wafer under treatment may crack, causing a treatment chamber to be littered with the fragments thereof. Especially in a heat treatment apparatus using a xenon flash lamp, a semiconductor wafer is instantaneously irradiated with considerably high-energy light, thereby causing rapid temperature rise of the surface of the semiconductor wafer in a moment. As a result, the semiconductor wafer may crack due to rapid thermal expansion of the surface.

The resultant fragments of the semiconductor wafer cannot be removed by heat treatment, for example. The treatment chamber should be opened for mechanically cleaning the inside. However, a heat treatment chamber with a complicated configuration cannot be easily cleaned, imposing difficulty in completely removing the source of pollution such as fragments of a semiconductor wafer.

SUMMARY OF THE INVENTION

The present invention is directed to a heat treatment apparatus for irradiating a substrate with light to heat the substrate.

According to the present invention, the heat treatment apparatus comprises a light source having a plurality of flash lamps, a chamber provided below the light source, a holding member for holding a substrate in the chamber, and a light shield provided in the chamber, the light shield blocking light emitted from the light source from reaching a metal surface inside the chamber.

The metal surface inside the chamber is prevented from being exposed to the flashlight emitted from the flash lamps. As a result, oxidation of the metal surface as a result of flashlight irradiation is suppressed, to thereby prevent the metal surface inside the chamber from being coated with an oxide film during heat treatment.

According to another aspect of the present invention, the heat treatment apparatus comprises a light source having a plurality of lamps, a chamber provided below the light source, a holding member for holding a substrate in a substantially horizontal position in the chamber, and a liner removably provided to the chamber along a wall surface of the chamber.

When the substrate cracks to litter the chamber with its fragments, the chamber can be easily cleaned by simply detaching the liner from the chamber.

It is therefore an object of the present invention to provide a heat treatment apparatus capable of preventing a metal surface inside a chamber from being coated with an oxide film during heat treatment.

It is another object of the present invention to provide a heat treatment apparatus capable of easily cleaning a chamber.

These and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiment of the present invention will be described in detail with reference to the drawings.

Figure 1:
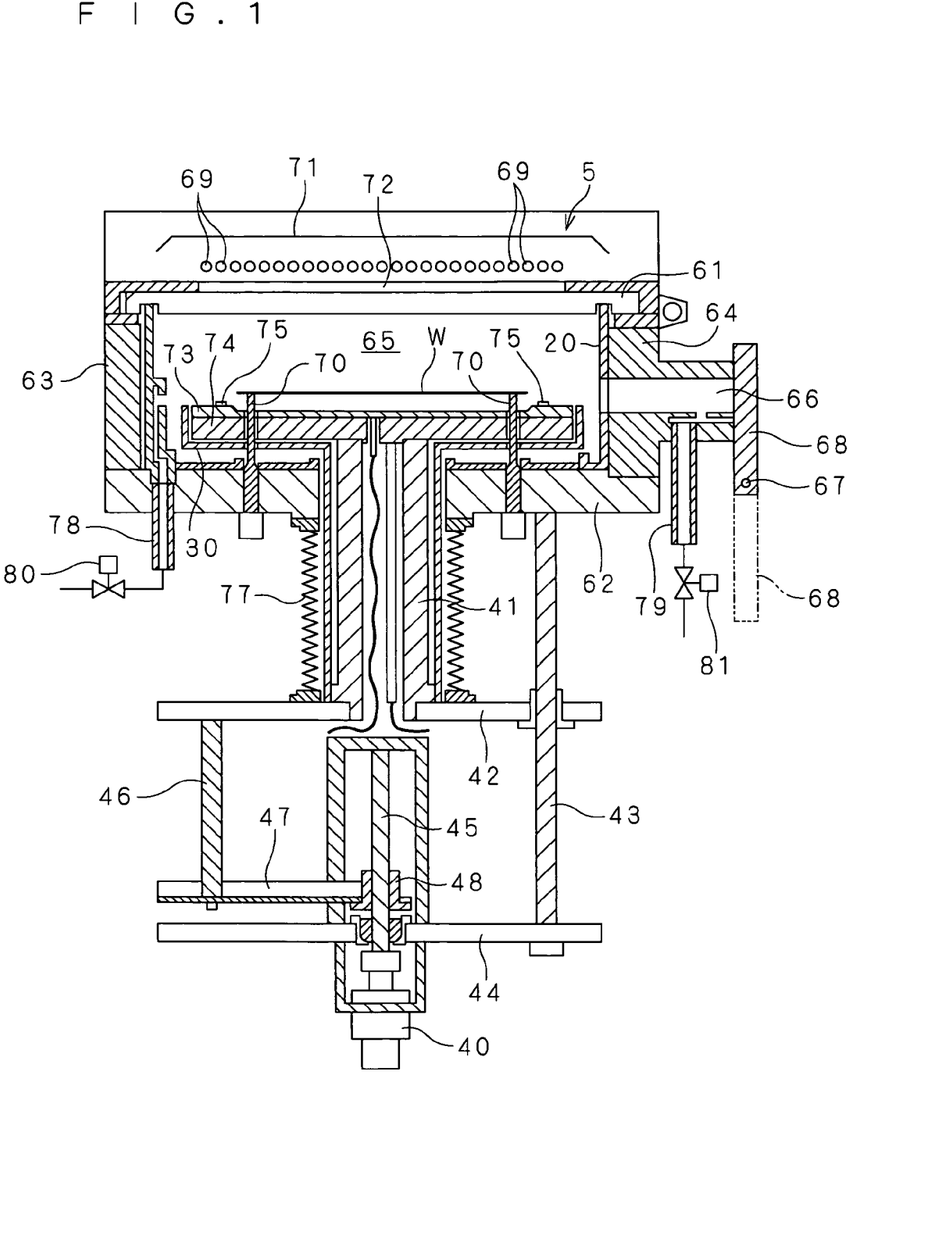
FIGS. 1 and 2 are side sectional views each showing the configuration of a heat treatment apparatus according to the present invention.
Figure 2:
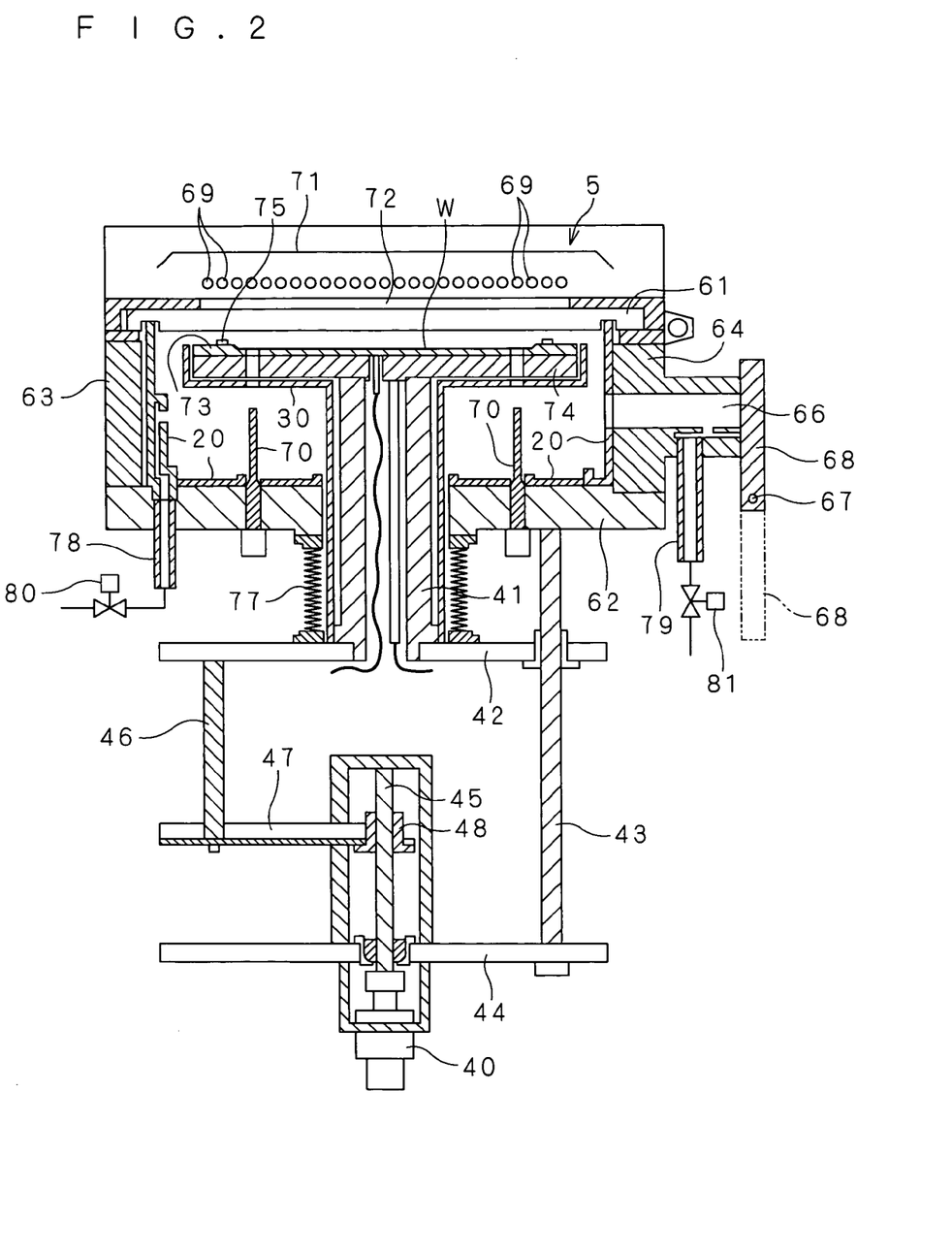

FIGS. 1 and 2 are side sectional views each showing the configuration of a heat treatment apparatus according to the present invention which is intended for heat treatment of a substrate such as a semiconductor wafer by means of irradiation with flashlight emitted from a xenon flash lamp.

The heat treatment apparatus of the present invention comprises a chamber 65 for heat treatment of a semiconductor wafer W stored therein. The chamber 65 is formed by a translucent plate 61, a base plate 62, and a pair of side plates 63 and 64. As an example, the translucent plate 61 as the upper portion of the chamber 65 includes an infrared-transparent material such as quartz. The translucent plate 61 is operative to function as a chamber window for allowing light emitted from a light source 5 to pass therethrough to be guided to the chamber 65. As an example, the base plate 62 as the lower portion, and the side plates 63 and 64 as the side walls of the chamber 65, include a metal material exhibiting excellence in strength and heat resistance such as stainless steel.

Support pins 70 are provided in an erect manner to the base plate 62, penetrating a heat diffusion plate 73 and a hot plate 74 together constituting holding means of the semiconductor wafer W to be discussed later to support the semiconductor wafer W from the lower surface thereof. The side plate 64 is provided with an opening 66 for transporting the semiconductor wafer W to and from the chamber 65. A gate valve 68 allows opening and closing of the opening 66 by its rotation about an axis 67. The semiconductor wafer W is transported to the chamber 65 by a transport robot not shown when the opening 66 is in an open state. The opening 66 is brought to a closed state by the gate valve 68 when the semiconductor wafer W is to be subjected to heat treatment in the chamber 65.

The chamber 65 is located below the light source 5. The light source 5 comprises more than one xenon flash lamp 69 (hereinafter also simply referred to as "flash lamp 69"), and a reflector 71. The present preferred embodiment comprises 25 xenon flash lamps 69. The plurality of flash lamps 69 are rod-shaped lamps each having an elongated cylindrical shape. The flash lamps 69 are parallel to each other in an two-dimensional array, with the longitudinal directions each being in line with a horizontal direction. The reflector 71 is located over the plurality of flash lamps 69 to be covered in their entirety.

The xenon flash lamps 69 each include a glass tube filled with xenon gas inside and having an anode and a cathode on both ends connected to a capacitor, and a trigger electrode wounded around the outer periphery of the glass tube. Xenon gas is an electrically insulating material, and thus in a normal state, does not allow electricity to flow in the glass tube. However, application of a high voltage to the trigger electrode for insulation breakdown causes electricity stored in the capacitor to instantaneously flow into the glass tube, whereby resultant Joule heat is applied to xenon gas to cause light emission. In each one of the xenon flash lamps 69, electrostatic energy preliminarily stored therein is converted into extremely short light pulses ranging between 0.1 to 10 milliseconds. That is, the xenon flash lamps 69 characteristically emit light of considerably higher intensity as compared with a light source for continuous lightning.

A light diffusion plate 72 is interposed between the light source 5 and the translucent plate 61. The light diffusion plate 72 is a quartz glass member as an infrared-transparent material with a surface provided with a light diffusion property.

Part of the light emitted from the flash lamps 69 directly passes through the light diffusion plate 72 and the translucent plate 61, then entering the chamber 65. Other part of the light emitted from the flash lamps 69 is reflected once by the reflector 71, and thereafter, passes through the light diffusion plate 72 and the translucent plate 61, then entering the chamber 65.

The chamber 65 is provided therein with the hot plate 74 and the heat diffusion plate 73. The heat diffusion plate 73 is attached by adhesion on the upper surface of the hot plate 74. Displacement preventing pins 75 for the semiconductor wafer W are provided on the surface of the heat diffusion plate 73.

The hot plate 74 serves to perform preheating (assist heating) of the semiconductor wafer W. The hot plate 74, which is an aluminum nitride member, comprises therein a heater and a sensor for controlling the heater. The heat diffusion plate 73 serves to diffuse heat energy from the hot plate 74, thereby uniformly preheating and holding the semiconductor wafer W. The heat diffusion plate 73 includes a low heat conductivity material such as sapphire ($Al_2O_3$) or quartz.

The wall surface of the chamber 65 is fitted with a liner 20. The liner 20 is removably provided to the chamber 65 with no fixed relation therebetween. The wall surface of the chamber 65 is defined as the inner wall surfaces of the side plates 63 and 64, and the base plate 62. As an example, the liner 20 is a quartz member having a closed-end cylindrical shape that covers all the inner wall surfaces of the side plates 63 and 64, and the base plate 62. That is, the metal surface inside the chamber 65 is entirely covered with the liner 20.

Figure 3:
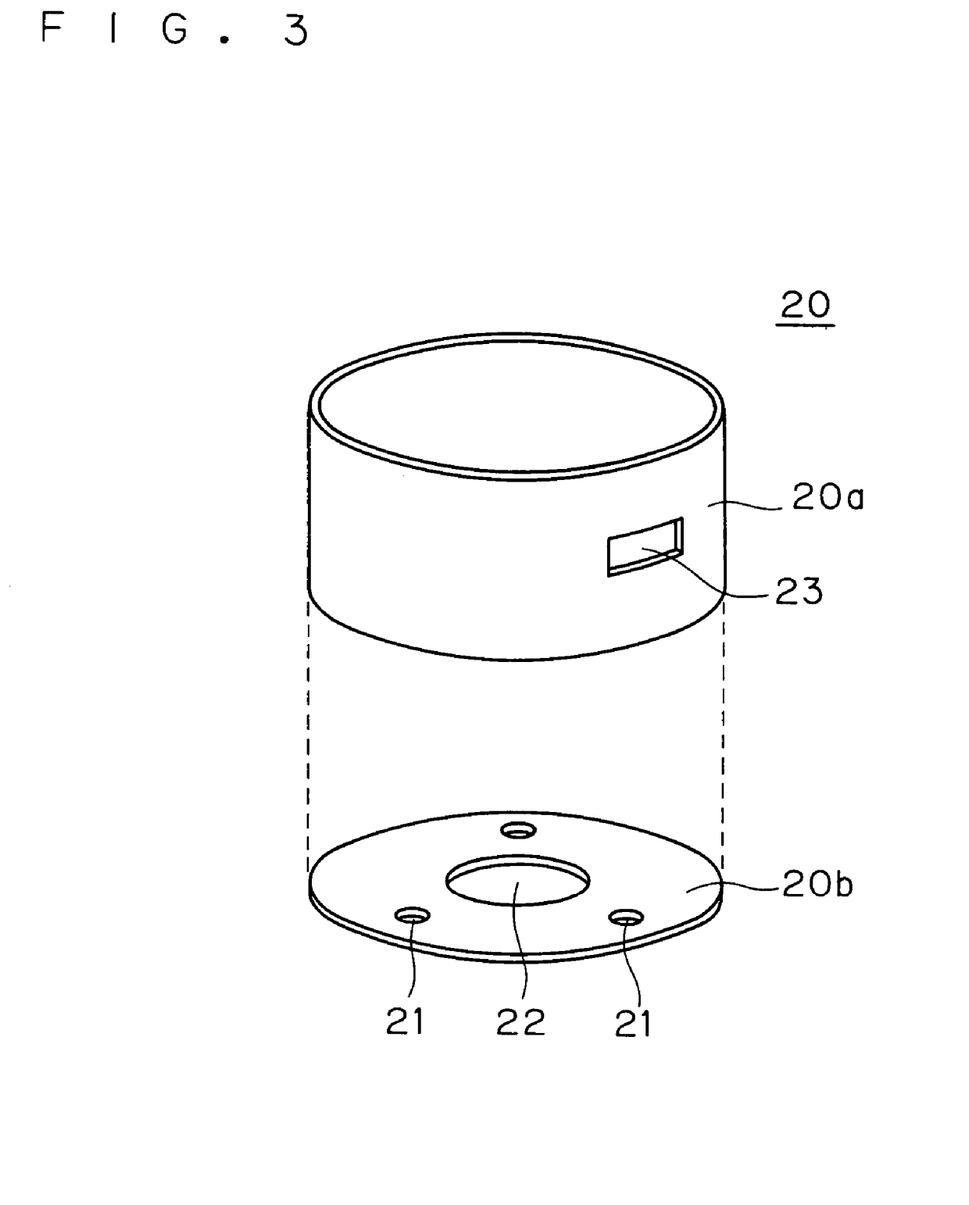
FIG. 3 is a perspective view of a liner constituting the heat treatment apparatus shown in FIG. 1.

FIG. 3 is a perspective view of the liner 20. In the present preferred embodiment, the liner 20 has a closed-end cylindrical shape comprising a tubular portion 20a for covering the side plates 63 and 64, and a base portion 20b for covering the base plate 62. The tubular portion 20a and the base portion 20b are separately formed and then joined. That is, the liner 20 is a divided member in which the tubular portion 20a and the base portion 20b are separable. The base portion 20b of the liner 20 is provided with a hole 22 for allowing upward and downward movement of a tubular member 41, and through holes 21 for allowing the support pins 70 to pass therethrough. Though omitted from FIG. 3 for convenience of description, the hole 22 and the through holes 21 are provided with annular portions in their perimeters slightly protruding in an upward direction. When the liner 20 is littered with fragments of the semiconductor wafer W, for example, to necessitate cleaning, these annular portions serve to prevent drop of such fragments from the hole 22 and the through holes 21. The tubular portion 20a is provided with an opening 23 for allowing transportation of the semiconductor wafer W to and from the chamber 65, and a passage (not shown) for allowing gas to pass therethrough which flows from an introduction path 78 toward a discharge path 79. The liner 20 is not limited to a divided member, but it may alternatively have a closed-end cylindrical shape molded in one piece.

Figure 4:
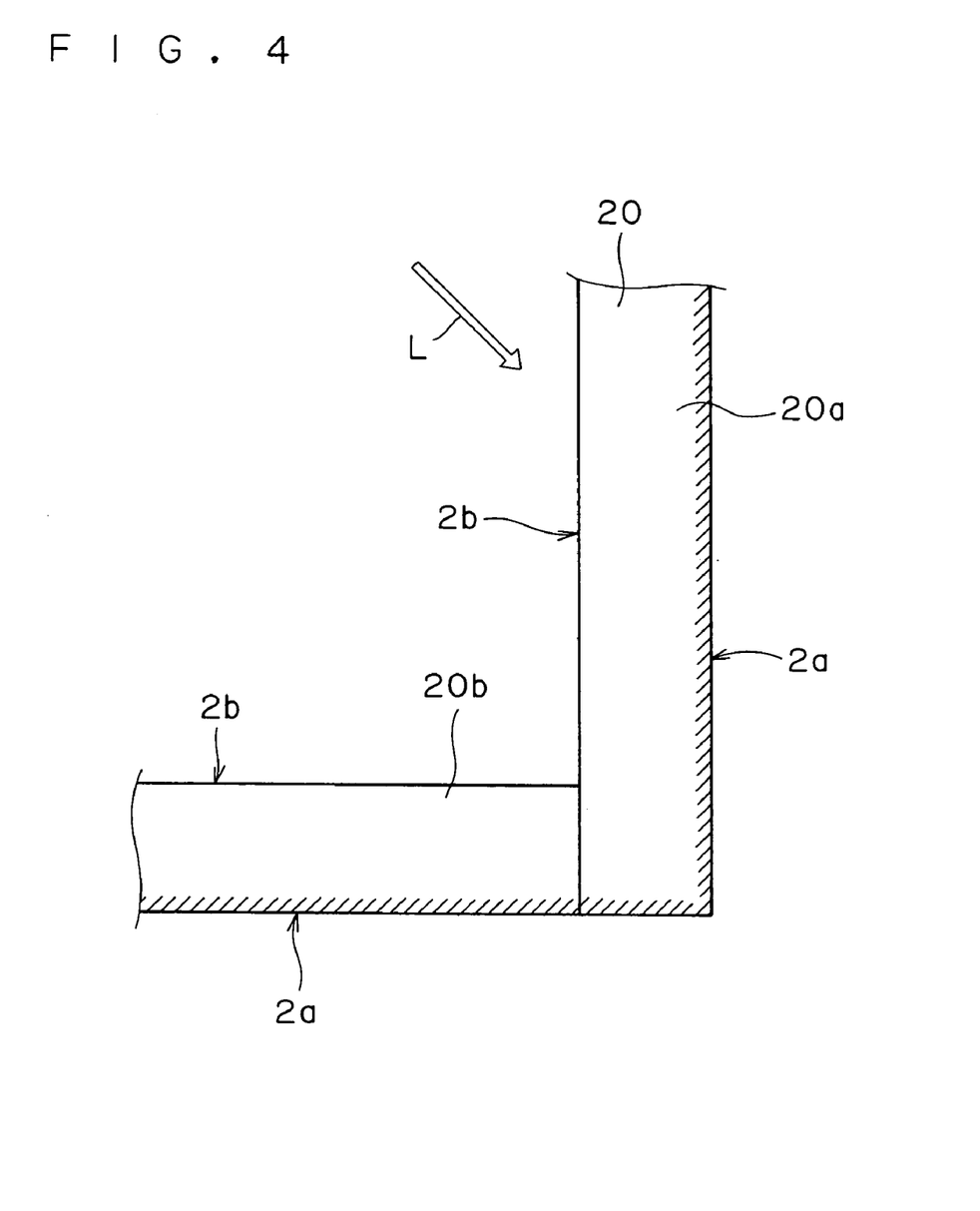
FIG. 4 is a partially enlarged view of the liner.

FIG. 4 is a partially enlarged view of the liner 20. An outer surface 2a as part of the quartz surface of the liner 20 and facing the metal surface of the chamber 65 (that is, the inner wall surfaces of the side plates 63 and 64, and of the base plate 62) is subjected to honing for roughening. An inner surface 2b is not subjected to honing, and thus, it has greater smoothness than the outer surface 2a.

In the present preferred embodiment, honing as one of surface roughening techniques includes dry honing and wet honing. In wet (liquid) honing for surface roughening of the outer surface 2a of the liner 20, the outer surface 2a is sprayed at high speed with a liquid such as water that contains powdered abrasives (abrasive grains) kept in suspension therein. In wet honing, surface roughness is adjusted by controlling conditions such as spray pressure and spray speed of a liquid, and the quantity, type, shape, size, hardness, the specific gravity, and concentration of suspension of abrasives.

In dry honing for surface roughening of the outer surface 2a of the liner 20, the outer surface 2a is sprayed at high speed with abrasives by means of air. Surface roughness is also adjusted in dry honing by controlling conditions such as spray pressure and spray speed of air, and the quantity, type, shape, size, hardness, and the specific gravity of abrasives.

In either honing, abrasives may be particles including silicon carbide, alumina, zirconia, stainless material, iron, glass beads, plastic, and the like. In the present preferred embodiment, the outer surface 2a of the liner 20 is roughened by honing to have average surface roughness (Ra) of not less than 0.2 μm (preferably, not less than 1.6 μm). The inner surface 2b has greater smoothness than the outer surface 2a (preferably, with average surface roughness (Ra) of not more than 6.3 μm).

Both dry and wet honing provide surface roughening to put a so-called satin finish on the outer surface 2a of the liner 20. Accordingly, when flashlight L emitted from the flash lamps 69 reaches the inner surface 2b to enter the liner 20, the outer surface 2a after being subjected to surface roughening serves to scatter the flashlight L. As a result, the flashlight L does not outwardly exit from the outer surface 2a. That is, the liner 20 is operative to serve as a light shield for blocking the light emitted from the flash lamps 69 from reaching the metal surface inside the chamber 65. The metal surface inside the chamber 65 is entirely covered with the liner 20 as a light shield, and hence, the light emitted from the flash lamps 69 never reaches any part of this metal surface.

A heat reflector 30 is provided to surround the hot plate 74, the heat diffusion plate 73, and the tubular member 41 for supporting the plates 74 and 73, except the upper surface of the heat diffusion plate 73. The heat reflector 30 is also a quartz member, and both surfaces thereof are further subjected to the foregoing honing process. The heat reflector 30 serves to limit conduction of heat energy emitted from the hot plate 74 to the heat diffusion plate 73.

Actuation of a motor 40 causes the heat diffusion plate 73 and the hot plate 74 to move up and down between the transportation position of the semiconductor wafer W shown in FIG. 1 and the heat treatment position of the semiconductor wafer W shown in FIG. 2.

The hot plate 74 is coupled through the tubular member 41 to a moving plate 42. The moving plate 42 is guided through a guide member 43 suspended from the base plate 62 of the chamber 65 to be movable up and down. A fixed plate 44 fixed to the lower end of the guide member 43 has a central portion where the motor 40 is provided to rotatably drive a ball screw 45. The ball screw 45 is threadedly engaged with a nut 48 that is coupled through coupling members 46 and 47 to the moving plate 42. The heat diffusion plate 73 and the hot plate 74 are thereby allowed to move up and down by means of actuation of the motor 40 between the transportation position of the semiconductor wafer W shown in FIG. 1 and the heat treatment position of the semiconductor wafer W shown in FIG. 2. Upward and downward movement of the heat diffusion plate 73 and the hot plate 74 causes the heat reflector 30 provided above the moving plate 42 to move up and down.

The heat diffusion plate 73 and the hot plate 74 descend to the transportation position of the semiconductor wafer W shown in FIG. 1 for mounting the semiconductor wafer W on the support pins 70 that is transported through the opening 66 to the chamber 65 by means of a transport robot not shown, or for transporting the semiconductor wafer W mounted on the support pins 70 from the chamber 65 through the opening 66. In the state of FIG. 1, the upper ends of the support pins 70 pass through the holes provided in the heat diffusion plate 73 and the hot plate 74, protruding upward from the surface of the heat diffusion plate 73.

For heat treatment of the semiconductor wafer W, the heat diffusion plate 73 and the hot plate 74 are elevated to the heat treatment position of the semiconductor wafer W shown in FIG. 2 which is higher than the upper ends of the support pins 70. In the process of moving up the heat diffusion plate 73 and the hot plate 74 from the transportation position of FIG. 1 to the heat treatment position of FIG. 2, the semiconductor wafer W mounted on the support pins 70 is transferred to the heat diffusion plate 73. The transferred semiconductor wafer W is elevated with the lower surface supported by the surface of the heat diffusion plate 73, reaching a position close to the translucent plate 61 to be horizontally held thereat in the chamber 65. Conversely, in the process of moving down the heat diffusion plate 73 and the hot plate 74 from the heat treatment position of FIG. 2 to the transportation position of FIG. 1, the semiconductor wafer W supported on the heat diffusion plate 73 is transferred to the support pins 70.

When the heat diffusion plate 73 and the hot plate 74 for supporting the semiconductor wafer W are held at the heat treatment position, the translucent plate 61 is interposed between the semiconductor wafer W supported on the heat diffusion plate 73, the hot plate 74, and the light source 5. The heat diffusion plate 73 and the light source 5 are allowed to have an arbitrary distance therebetween by controlling the amount of rotation of the motor 40.

Retractable bellows 77 are provided between the base plate 62 of the chamber 65 and the moving plate 42 to surround the tubular member 41, whereby the chamber 65 is hermetically sealed. The bellows 77 are contracted when the heat diffusion plate 73 and the hot plate 74 are elevated to the heat treatment position, whereas the bellows 77 extend when the heat diffusion plate 73 and the hot plate 74 descend to the transportation position to isolate the atmosphere in the chamber 65 from an external atmosphere.

The side plate 63 of the chamber 65 opposite to the opening 66 is provided with the introduction path 78 cooperatively connected to an open/close valve 80. The introduction path 78 serves to introduce required process gas such as inert nitrogen gas into the chamber 65. The opening 66 at the side plate 64 is provided with the discharge path 79 cooperatively connected to an open/close valve 81. The discharge path 79 serves to discharge gas from the chamber 65, and is connected through the open/close valve 81 to exhaust means not shown. The liner 20 is provided with a passage for allowing gas to pass therethrough which flows from the introduction path 78 toward the discharge path 79.

Next, it will be discussed how the heat treatment apparatus having the foregoing configuration performs heat treatment of the semiconductor wafer W. The semiconductor wafer W to be subjected to heat treatment by this apparatus is an ion-implanted semiconductor wafer.

When the heat diffusion plate 73 and the hot plate 74 are at the transportation position of the semiconductor wafer W shown in FIG. 1, the semiconductor wafer W is transported through the opening 66 to the chamber 65 and is then mounted on the support pins 70 by means of a transport robot not shown. When transportation of the semiconductor wafer W to the chamber 65 is finished, the opening 66 is closed by the gate valve 68. The motor 40 is thereafter actuated to elevate the heat diffusion plate 73 and the hot plate 74 to the heat treatment position of the semiconductor wafer W shown in FIG. 2, whereby the semiconductor wafer W is horizontally held thereat. Further, the open/close valves 80 and 81 are brought to an open state to produce a flow of nitrogen gas in the chamber 65.

The heat diffusion plate 73 and the hot plate 74 are brought to a heated state by the heater stored in the hot plate 74 to a predetermined temperature. The semiconductor wafer W is thus preheated by contacting the heat diffusion plate 73 in a heated state when the heat diffusion plate 73 and the hot plate 74 are elevated to the heat treatment position of the semiconductor wafer W, to cause gradual temperature rise of the semiconductor wafer W.

The semiconductor wafer W continues to be heated by the heat diffusion plate 73. When temperature rise of the semiconductor wafer W occurs, a temperature sensor not shown keeps monitoring to determine whether the surface temperature of the semiconductor wafer W reaches a preheating temperature T1.

As an example, the preheating temperature T1 is about 200 to 600° C. Temperature rise of the semiconductor wafer W to the preheating temperature T1 having such a range does not cause diffusion of ions implanted into the semiconductor wafer W.

At the time when the surface temperature of the semiconductor wafer W reaches the preheating temperature T1, the flash lamps 69 light up for flash heating, for a period of about 0.1 to 10 milliseconds. In each one of the flash lamps 69, electrostatic energy preliminary stored is converted into light pulses of such an extremely short duration. That is, the flash lamps 69 emit light of considerably high intensity.

The semiconductor wafer W subjected to such flash heating experiences instantaneous rise in surface temperature to a temperature T2 of about 1000 to 1100° C. required for ion activation of the semiconductor wafer W. Rise of the surface temperature of the semiconductor wafer W to the processing temperature T2 having such a range causes activation of ions implanted into the semiconductor wafer W.

Rise of the surface temperature of the semiconductor wafer W to the processing temperature T2 requires a very short period of about 0.1 to 10 milliseconds, and hence, activation of ions implanted into the semiconductor wafer W is completed in a short period. As a result, no diffusion of ions implanted into the semiconductor wafer W occurs, thereby preventing rounding of a profile of ions implanted into the semiconductor wafer W. Ion activation requires a period of time considerably shorter than a period required for ion diffusion, and hence, ion activation is completed even in a short period of about 0.1 to 10 milliseconds that causes no ion diffusion.

The semiconductor wafer W is preheated by means of the hot plate 74 to rise its surface temperature to the preheating temperature T1 of about 200 to 600° C. prior to lighting of the flash lamps 69 for heating the semiconductor wafer W. The semiconductor wafer W is thereby allowed to rapidly rise in temperature to the processing temperature T2 of about 1000 to 1100° C.

The flashlight emitted from the flash lamps 69 of considerably high intensity is blocked by the outer surface 2*a* of the liner 20 after being subjected to surface roughening by honing process, whereby the metal surface inside the chamber 65 is prevented from being exposed to the flashlight emitted from the flash lamps 69. As a result, oxidation of metal as a result of flashlight irradiation is suppressed, to thereby prevent the metal surface in the chamber 65 from being coated with an oxide film.

Especially in the present preferred embodiment, the metal surface inside the chamber 65 is entirely covered with the liner 20, and hence, the metal surface in the chamber 65 is prevented in its entirety from being coated with an oxide film as a result of flashlight irradiation.

After flash heating, the motor 40 is actuated to move down the heat diffusion plate 73 and the hot plate 74 to the transportation position of the semiconductor wafer W shown in FIG. 1, and the gate valve 68 switches the opening 66 from a closed state to an open state. Further, the semiconductor wafer W mounted on the support pins 70 is transported from the chamber 65 by means of a transport robot not shown. Following the process described so far, a series of heat treatment operations is completed.

As discussed, in the process of heating the semiconductor wafer W by lighting the flash lamps 69, the semiconductor wafer W may crack due to rapid thermal expansion of the wafer surface. Such cracking may cause the chamber 65 to be littered with fragments of the semiconductor wafer W.

In the present preferred embodiment, the liner 20 is removably provided to the chamber 65 along the chamber wall surface. Even when the semiconductor wafer W cracks to litter the chamber 65 with its fragments, the chamber 65 can be easily cleaned by simply detaching the liner 20 from the chamber 65. Smoothness of the inner surface 2*b* of the liner 20 especially serves to promote cleaning of the liner 20 itself after detachment.

Next, it will be discussed how the liner 20 is detached from the chamber 65. The light source 5 hingedly connected to the chamber 65 is opened in an upward direction. Thereafter, the light diffusion plate 72 and the translucent plate 61 are removed. Next, a screw which holds the tubular member 41 to the moving plate 42 is unscrewed to remove the heat diffusion plate 73, the hot plate 74, and the tubular member 41 from the top opening of the chamber 65. The heat reflector 30 is also removed at this time from the top opening of the chamber 65. The resultant state is shown in FIG. 5.

Figure 5:
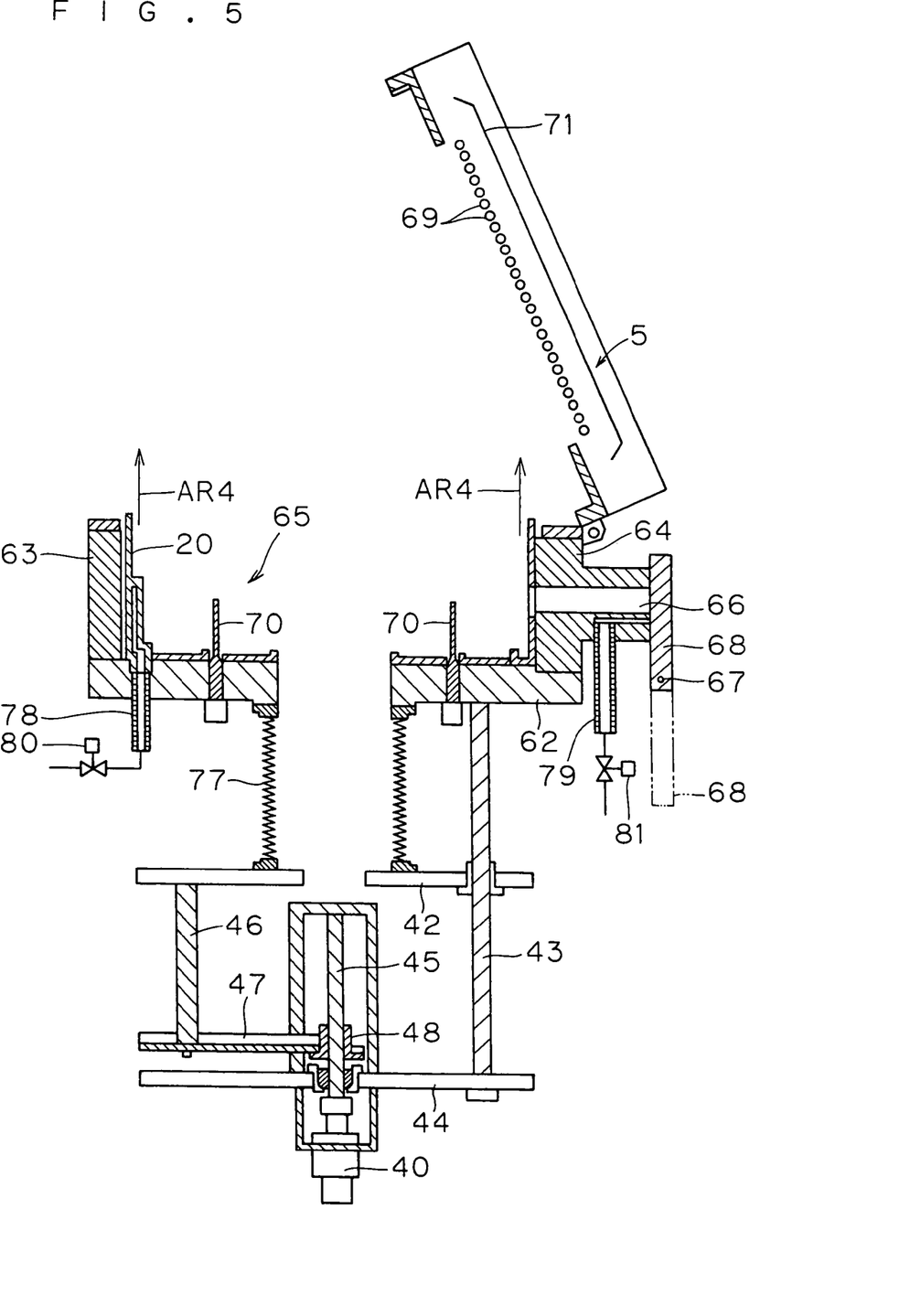
FIG. 5 is a side sectional view of the heat treatment apparatus when the liner is to be detached.

As indicated by an arrow AR4 of FIG. 5, the removable liner 20 is thereafter detached from the chamber 65. When cleaning is finished and the liner 20 is to return to its position, the foregoing detachment procedure is completely reversed.

The present invention is not limited to the preferred embodiment described so far. As an example, the number of the xenon flash lamps 69 provided to the light source 5 is arbitrarily determined and is not limited to twenty five as in the foregoing preferred embodiment. Further, the flash lamps 69 are not limited to xenon flash lamps. As an example, the flash lamps 69 may be krypton flash lamps.

The light source 5 may comprise another type of lamps (such as halogen lamps) instead of the flash lamps 69 to heat the semiconductor wafer W by means of irradiation of light emitted from these lamps. The technique according to the present invention is also applicable to the heat treatment apparatus comprising such an alternative type of the light source 5. That is, a chamber can be easily cleaned by removable provision of a quartz liner along the chamber wall surface. Further, a quartz liner after being subjected to honing process is provided along the inner wall surface of a chamber, which liner serves to block the light emitted from lamps from reaching the metal part of the wall surface inside the chamber. As a result, this metal part can be prevented from oxidation.

In the preferred embodiment described above, the liner 20 has the outer surface 2a subjected to surface roughening by honing, and the inner surface 2b having great smoothness. Alternatively, both surfaces of the liner 20 may be subjected to surface roughening by honing. Such an alternative improves light blocking effect by the liner 20, whereby the flashlight emitted from the flash lamps 69 can be blocked with higher reliability from reaching the metal surface inside the chamber 65. However, the inner surface 2b of the liner 20 having great smoothness as in the foregoing preferred embodiment serves to facilitate cleaning of the chamber 65 necessitated by cracking of the semiconductor wafer W during treatment, for example.

In the preferred embodiment described above, a semiconductor wafer is targeted for ion activation by means of light irradiation. However, a semiconductor wafer is not a limited target for the processing by the heat treatment apparatus of the present invention. As an example, a glass substrate provided with various types of silicon films thereon such as a silicon nitride film or a polycrystalline silicon film may be subjected to the processing by the heat treatment apparatus of the present invention. More particularly, a polycrystalline silicon film is provided by CVD on a glass substrate, and thereafter, this polycrystalline silicon film is subjected to ion implantation of silicon to be brought to an amorphous state. A silicon oxide film is further provided as an antireflection film on the amorphous silicon film thereby formed. In this state, the heat treatment apparatus of the present invention serves to emit light to the amorphous silicon film in its entirety, whereby the amorphous silicon film is switched to a polycrystalline state to form a polycrystalline silicon film.

Further alternatively, the heat treatment apparatus of the present invention may be directed to a TFT substrate comprising a glass substrate, and an underlying silicon oxide film and a polysilicon film as a crystallized film of amorphous silicon provided on the glass substrate, in which impurities such as phosphorous or boron are implanted into the polysilicon film. In this case, the heat treatment apparatus of the present invention serves to emit light to the TFT substrate to activate the implanted impurities.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with flashlight to heat said substrate, comprising:
   a light source having a plurality of flash lamps;
   a chamber provided below said light source;
   a holding member for holding a substrate in said chamber; and
   a light shield provided in said chamber, said light shield blocking light emitted from said light source from reaching a metal surface inside said chamber,
   wherein said light shield is a quartz member with a quartz surface roughened by honing.

2. The heat treatment apparatus according to claim 1, wherein said chamber has a metallic side plate and a metallic bottom plate; and
   wherein said light shield has a closed-end cylindrical shape for covering inner wall surfaces of said side plate and said bottom plate.

3. The heat treatment apparatus according to claim 2, wherein said light shield is a divided member in which a tubular portion and a base portion are separable.

4. The heat treatment apparatus according to claim 3, wherein said light shield covers said metal surface inside said chamber in its entirety.

5. The heat treatment apparatus according to claim 4, wherein said quartz surface has an outer surface and an inner surface, said outer surface facing said metal surface inside said chamber and being roughed by honing, said inner surface having greater smoothness than said outer surface.

6. The heat treatment apparatus according to claim 5, wherein said outer surface has average surface roughness of not less than 0.2 µm.

7. A heat treatment apparatus for irradiating a substrate with flashlight to heat said substrate, comprising:
   a light source having a plurality of flash lamps;
   a chamber provided below said light source;
   a holding member for holding a substrate in a substantially horizontal position in said chamber; and
   a liner removably provided at said chamber, along an inner wall side surface and an inner wall base surface of said chamber to cover said side and base surfaces, said liner having a roughened outer surface facing said side and base surfaces of said chamber and an inner surface having greater smoothness than said outer surface.

8. The heat treatment apparatus according to claim 7, wherein said liner has a closed-end cylindrical shape.

9. The heat treatment apparatus according to claim 8, wherein said liner is a divided member in which a tubular portion and a base portion are separable.

10. The heat treatment apparatus according to claim 9, wherein said liner is quartz member.

11. A heat treatment apparatus for irradiating a substrate with flashlight to heat said substrate, comprising:
    a light source having a plurality of flash lamps;
    a chamber provided below said light source:
    a holding member for holding a substrate in said chamber; and
    a light shield provided in said chamber, said light shield blocking light emitted from said light source from reaching a metal surface inside said chamber, wherein said light shield has a roughened outer surface and an inner surface having greater smoothness than said outer surface.

12. The heat treatment apparatus according to claim 11, wherein said chamber has a metallic side plate and a metallic bottom plate; and
wherein said light shield has a closed-end cylindrical shape for covering inner wall surfaces of said side plate and said bottom plate.

13. The heat treatment apparatus according to claim 12, wherein said light shield is a divided member in which a tubular portion and a base portion are separable.

14. The heat treatment apparatus according to claim 13, wherein said light shield covers said metal surface inside said chamber in its entirety.

15. The heat treatment apparatus according to claim 14, wherein said outer surface has average surface roughness of not less than 0.2 μm.

16. A heat treatment apparatus for irradiating a substrate with flashlight to heat said substrate, comprising:
a light source having a plurality of flash lamps;
a chamber provided below said light source;
a holding member for holding a substrate in a substantially horizontal position in said chamber; and
a liner removably provided at said chamber, along an inner wall side surface and an inner wall base surface of said chamber to cover said side and base surfaces,
wherein said liner is a quartz member with a quartz surface roughened by honing.

17. The heat treatment apparatus according to claim 16, wherein said liner has a closed-end cylindrical shape.

18. The heat treatment apparatus according to claim 17, wherein said liner is a divided member in which a tubular portion and a base portion are separable.

* * * * *